(12) United States Patent
Chen

(10) Patent No.: US 6,456,500 B1
(45) Date of Patent: Sep. 24, 2002

(54) ASSEMBLING STRUCTURE FOR PORTABLE MEMORY DEVICE

(75) Inventor: Po-Tsang Chen, San-Hsia (TW)

(73) Assignee: Speed Tech Corp. (TW)

( * ) Notice: Subject to any disclaimer, the term of this patent is extended or adjusted under 35 U.S.C. 154(b) by 0 days.

(21) Appl. No.: 10/001,826

(22) Filed: Dec. 5, 2001

(51) Int. Cl.[7] .......................... H05K 7/00; H01R 13/28
(52) U.S. Cl. ..................... 361/752; 361/736; 439/135; 439/136; 439/140; 439/141; 439/144; 439/147
(58) Field of Search ................................ 361/752, 736, 361/741, 801–803, 756; 439/135, 136, 140, 141, 144, 147; 174/50

(56) References Cited

U.S. PATENT DOCUMENTS

| | | | | |
|---|---|---|---|---|
| 5,734,558 A | * | 3/1998 | Poplawski et al. | 361/752 |
| 5,797,771 A | * | 8/1998 | Garside | 439/610 |
| 5,920,459 A | * | 7/1999 | Weber et al. | 361/752 |
| 6,231,631 B1 | * | 5/2001 | Ko et al. | 439/172 |
| 6,297,448 B1 | * | 10/2001 | Hara | 175/52.3 |

* cited by examiner

Primary Examiner—David Martin
Assistant Examiner—Dameon E. Levi
(74) Attorney, Agent, or Firm—Troxell Law Office PLLC

(57) ABSTRACT

Assembling structure for portable memory device, including a memory device main body composed of a bottom cover, an upper cover and a circuit board. Two corners of one end of the bottom cover is formed with recessed sections. The other end thereof is formed with a thread hole. The upper cover is formed with hook boards and a through hole corresponding to the recessed sections and thread hole. The upper cover is mated and locked with the bottom cover by a bolt to clamp the circuit board. An adapter of the circuit board outward extends from the main body. A sheath is fitted around the main body. One end of the sheath is formed with a through hole through which the adapter outward protrudes. The sheath and the main body are formed with corresponding stop board and lateral projecting blocks, whereby the main body is slidable within the sheath to extend the adapter out of the sheath or retract the adapter therein.

11 Claims, 5 Drawing Sheets

ASSEMBLING STRUCTURE FOR PORTABLE MEMORY DEVICE

BACKGROUND OF THE INVENTION

The present invention is related to an assembling structure for portable memory device, and more particularly to a structure of a portable memory device which has small volume and can be easily assembled. The memory device can be easily carried under good protection.

The existent portable memory device of an electric appliances or a computer is used to process or store data. Such portable memory device is required to have small volume and be easily usable and portable. For example, the currently widely used flash RAM module which can be connected with a personal computer or notebook-type computer via a universal serial bus (USB) has small volume and can be easily carried.

However, when carried, the above memory device is generally placed in a pocket or a bag. In action, the protruding elements of the memory device (especially the USB connector) is very likely to be damaged due to collision or abnormal squeezing of alien article. Therefore, a sheath is used to cover and protect the protruding elements from being damaged. In use, the sheath must be taken off and is easy to miss.

Furthermore, due to limitation of volume and precision of the mold, the casings of the mini-type memory device can be hardly assembled by way of insertion or hooking. The casings are simply mated and locked with each other by bolts. Such procedure is time-consuming and troublesome and the appearance of the memory device is poor.

SUMMARY OF THE INVENTION

It is therefore a primary object of the present invention to provide an assembling structure for portable memory device, including a memory device main body composed of a bottom cover, an upper cover and a circuit board. Two corners of one end of the bottom cover is formed with recessed sections. The other end thereof is formed with a thread hole. The upper cover is formed with hook boards and a through hole corresponding to the recessed sections and thread hole. The upper cover is mated and locked with the bottom cover by a bolt to clamp the circuit board. An adapter of the circuit board outward extends from the main body. The memory device can be easily assembled and conveniently used.

It is a further object of the present invention to provide the above assembling structure in which a sheath is fitted around the main body of the memory device. One end of the sheath is formed with a through hole through which the adapter outward protrudes. The sheath and the main body are formed with corresponding stop board and lateral projecting blocks, whereby the main body is slidable within the sheath to extend the adapter out of the sheath or retract the adapter therein. Therefore, the memory device can be easily carried under protection.

The present invention can be best understood through the following description and accompanying drawings wherein:

DETAILED DESCRIPTION OF THE PREFERRED EMBODIMENT

Figure 1:
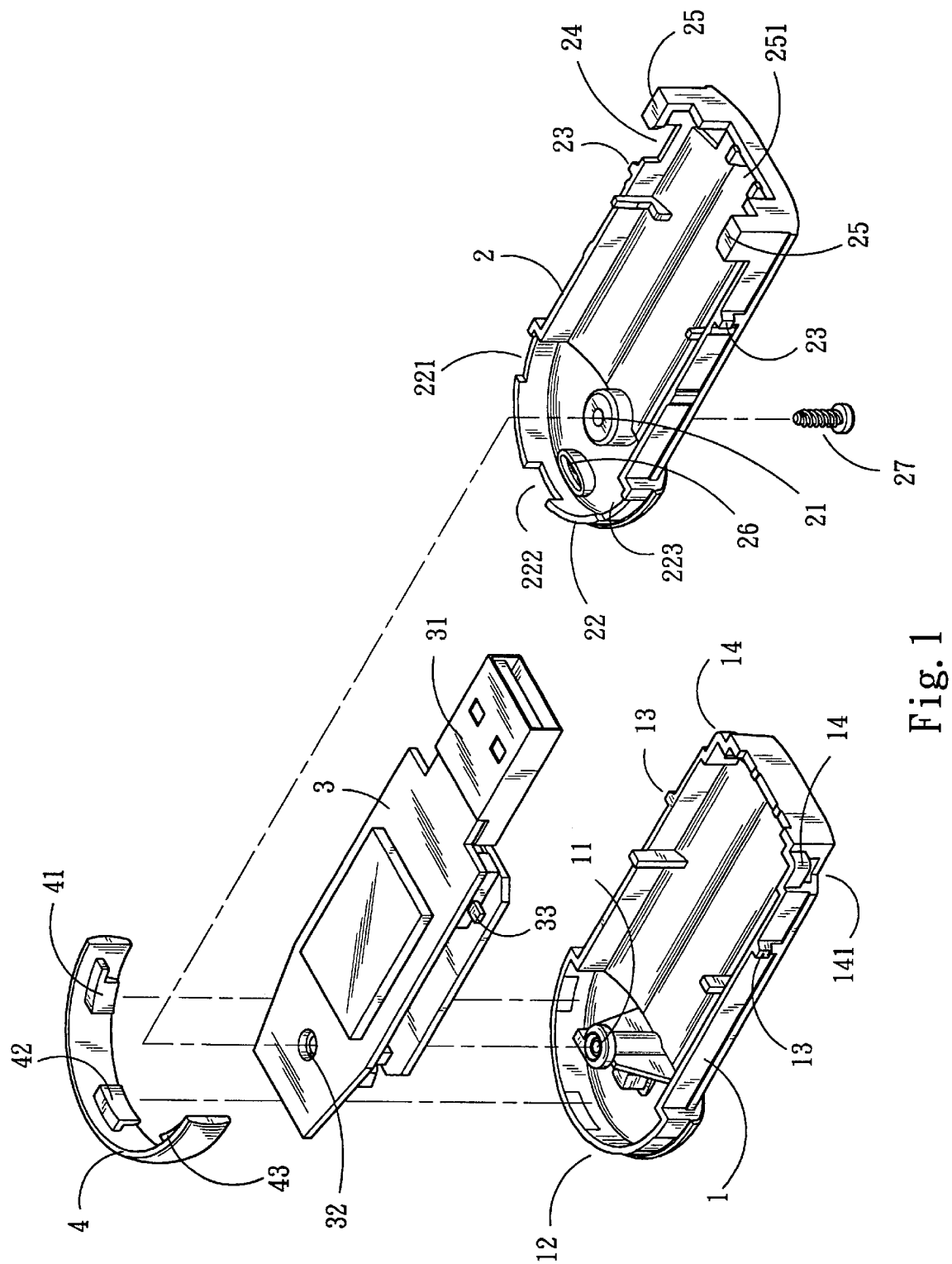
FIG. 1 is a perspective exploded view of the memory device main body of the present invention.
Figure 2:
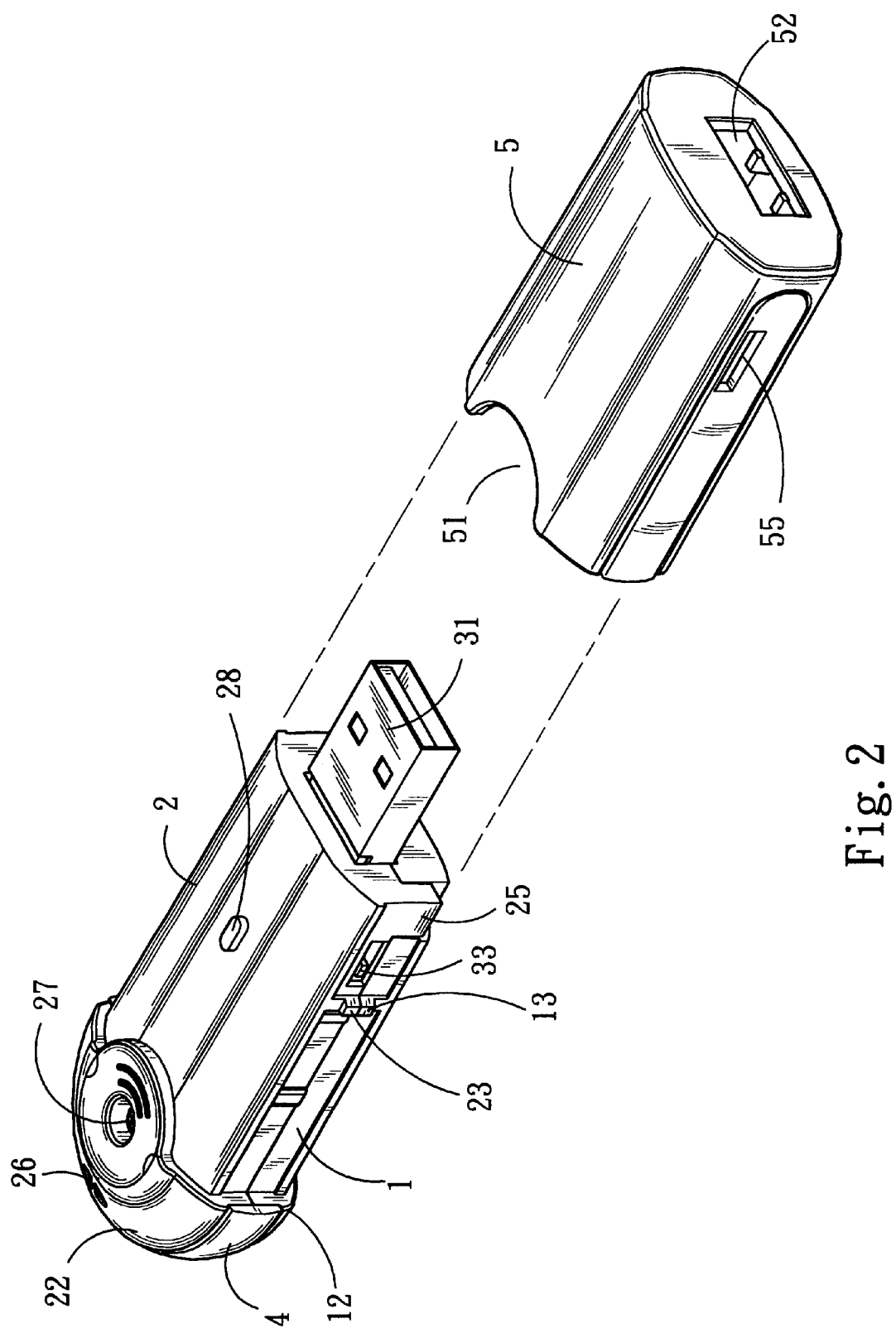
FIG. 2 is a partially assembled view of the present invention.
Figure 3:
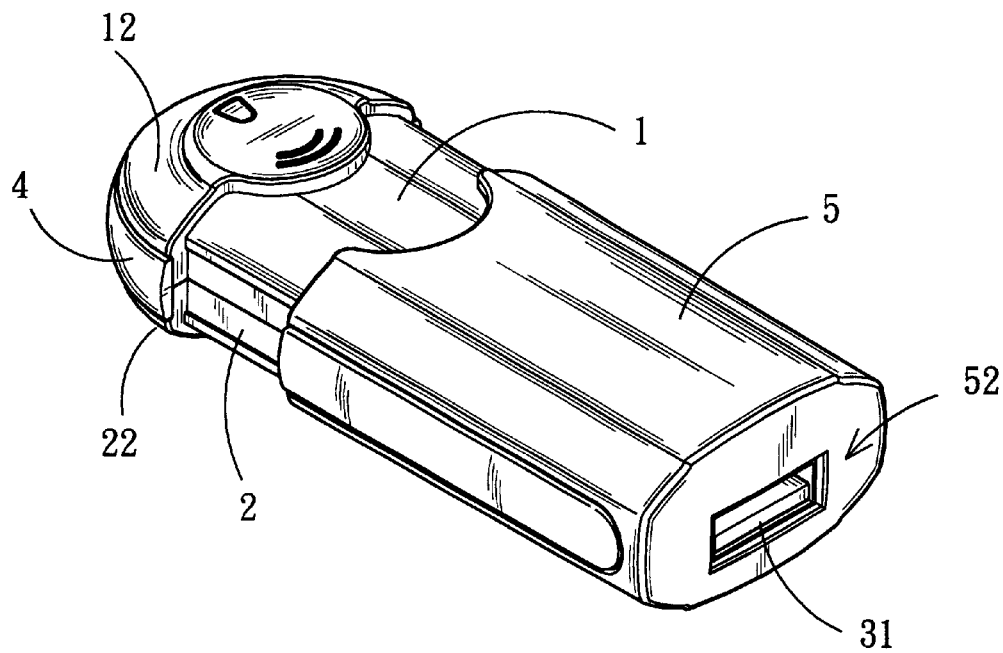
FIG. 3 shows that the adapter of the present invention is retracted into the sheath of the present invention when not used.
Figure 4:
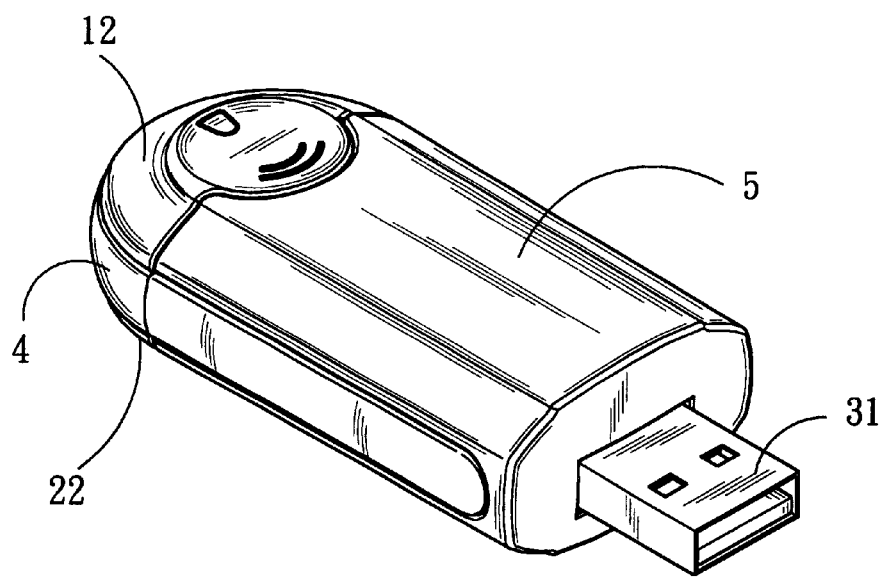
FIG. 4 shows that the adapter of the present invention is extended out of the sheath of the present invention when used.
Figure 5:
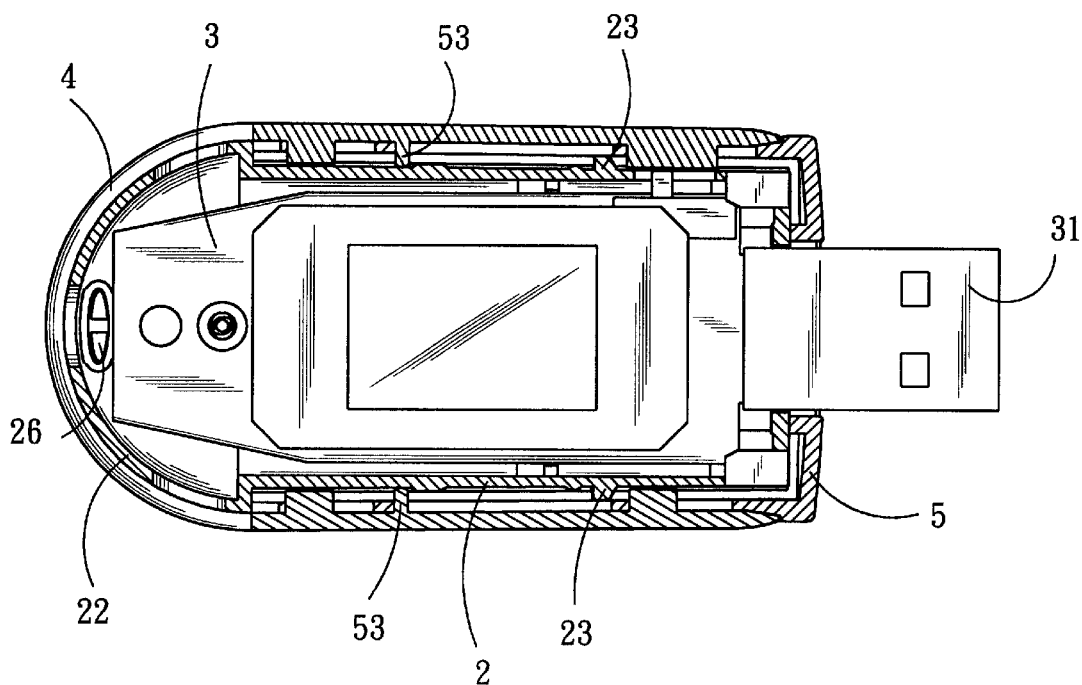
FIG. 5 is a top sectional view of the present invention, showing that the adapter is retracted.
Figure 6:
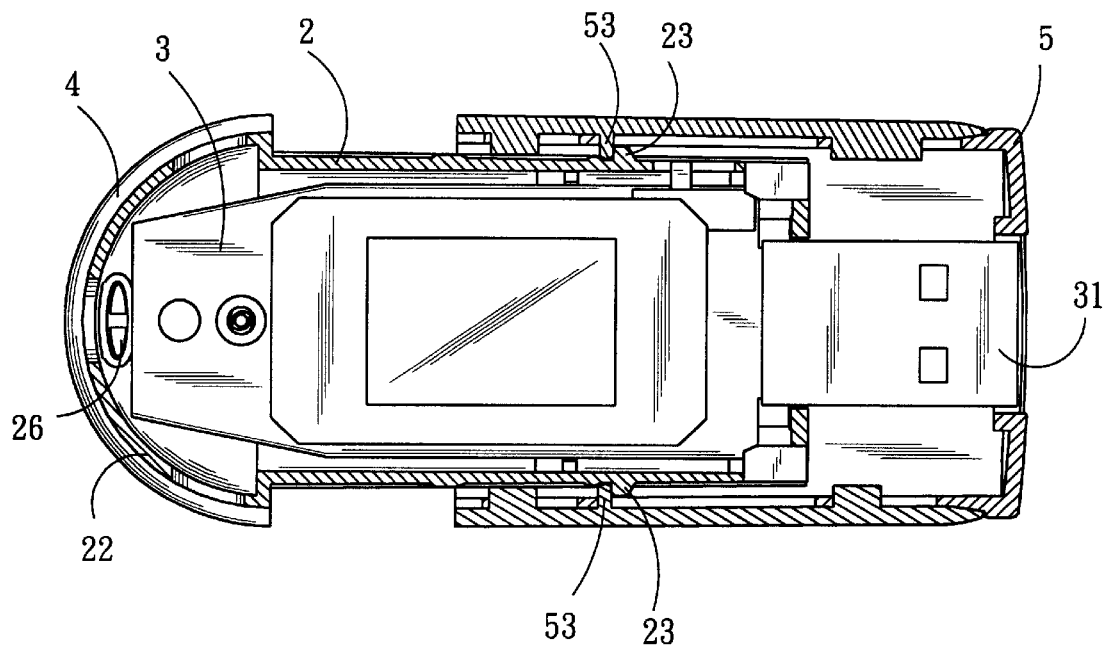
FIG. 6 is a top sectional view of the present invention, showing that the adapter is extended.
Figure 7:
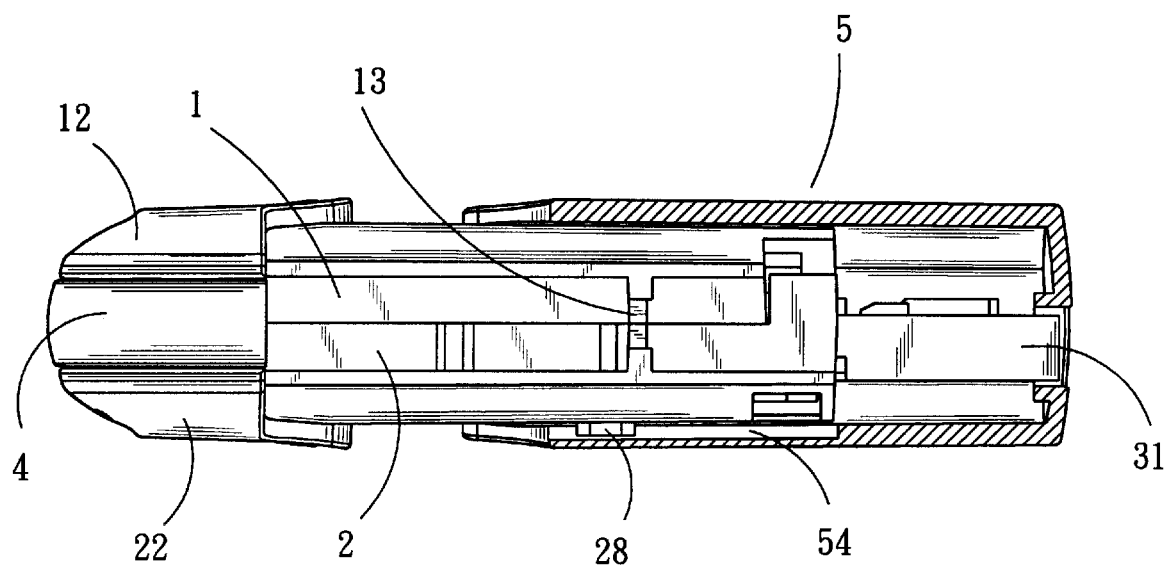
FIG. 7 is a side sectional view of the present invention, showing that the adapter is retracted.
Figure 8:
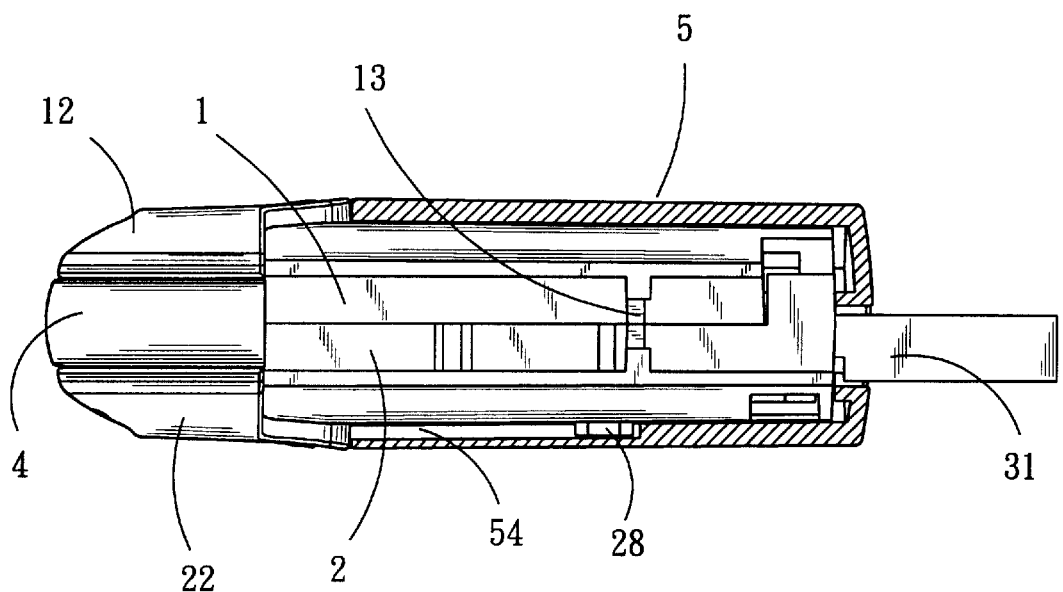
FIG. 8 is a side sectional view of the present invention, showing that the adapter is extended.

Please refer to FIGS. 1 and 2. The main body of the memory device of the present invention is composed of a bottom cover 1, an upper cover 2, a circuit board 3 and a lateral decorative strip 4. The bottom cover 1 is a casing having a central depression. One end of the bottom cover 1 is formed with a radially expanded arch edge 12. Two corners of the other end are formed with recessed sections 141. A projecting arch edge 14 is formed on each recessed section 141 and adjacent to the periphery of the opening of the bottom cover 1. The center of the expanded arch edge 12 is formed with a thread hole 11, Two lateral projecting blocks 13 are respectively formed on two sides of the bottom cover 1. The upper cover 2 is also a casing having a central depression. One end of the upper cover 2 is formed with a through hole 21 and expanded arch edge 22 corresponding to the thread hole 11 and expanded arch edge 12 of the bottom cover 1. The periphery of the expanded arch edge 22 is formed with multiple notches 221, 222, 223. In addition, a hook hole 26 is formed between the through hole 21 and the expanded arch edge 22 for a string or a key ring to pass therethrough and tied. The middle of the other end of the upper cover 2 is formed with a dent 251. Two corners of the end of the upper cover 2 are formed with projecting hook boards 25 corresponding to the recessed sections 141. In addition, lateral projecting blocks 23 are formed on two sides of the upper cover 2 corresponding to the lateral projecting blocks 13 of the bottom cover 1. A lateral notch 24 is formed beside a lateral projecting block 23. The center of the back side of the upper cover 2 is formed with a projecting block 28. A memory module and relevant circuits are received in the circuit board 3. One end is formed with a through hole 32, while the other end has an extending adapter 31 (which can be a USB interface). A shift switch 33 is disposed on one side of the circuit board for controlling the execution of writing of the memory module. The lateral decorative strip 4 is an arched strip. The inner side thereof is formed with multiple hook sections 41, 42, 43 having opening facing downward.

When assembled, the circuit board 3 is positioned between the bottom cover 1 and upper cover 2. The hook boards 25 of the upper cover 2 are inserted into the recessed sections 141 of the bottom cover 1 and hooked on the projecting arch edges 14. Then the hook sections 41, 42, 43 of the lateral decorative strips 4 are respectively hooked on the expanded arch edge 12 of the bottom cover 1 and the notches 221, 222, 223 of the upper cover 2 are pressed and fitted onto the hook sections 41, 42, 43 and located thereon. Finally, a bolt 27 is passed through the through holes 21, 32 and screwed into the thread hole 11, whereby the bottom cover 1 and the upper cover 2 can firmly clamp the circuit board 3. The adapter 31 outward protrudes from the dent 251 of the upper cover 2. After assembled, the shift switch 33 of the circuit board 3 protrudes from the lateral notch 24 of the upper cover 2 and is exposed to outer side. A sheath 5 can be fitted around the main body of the memory device. One end of the sheath 5 is formed with an opening 51 for placing the main body therein. The other end of the sheath 5 is formed with a through hole 52 through which the adapter 31 outward protrudes. The middle portions of two sides of the sheath 5 are respectively formed with two inward extending stop boards 53. A lateral opening 55 is formed beside one of the stop boards 53. In addition, the inner side of the sheath 5 is formed with a longitudinally extending guide channel 54.

According to the above arrangement, by means of the hooking measure at one end, the assembling procedure of the main body is simplified and the assembling components are reduced so that the processing efficiency is enhanced and the cost is lowered. The lateral decorative strip 4 is disposed on the seam between the upper cover 1 and the bottom cover 1 so as to beautify the appearance.

FIGS. 3 to 8 show the retraction and protrusion operation of the adapter of the present invention. In use, the sheath 5 is fitted around the main body of the memory device with the adapter 31 extending out of the through hole 52 of the sheath 5. The projecting block 28 is inlaid in the guide channel 54 for guiding the main body. The sliding travel of the main body is restricted by the stop boards 53 which stop the lateral projecting blocks 13, 23. Accordingly, the adapter 31 can be outward extended from the through hole 52 for use or retracted therein for storage.

The above embodiment is only used to illustrate the present invention, not intended to limit the scope thereof. Many modifications of the above embodiment can be made without departing from the spirit of the present invention.

What is claimed is:

1. Assembling structure for portable memory device, comprising:
    a memory device main body, one end of the main body being provided with a projecting adapter, middle portions of two sides of the main body being respectively formed with two lateral projecting blocks; and
    a sheath, a first end of which is formed with an opening for placing the main body therein, a second end of the sheath is formed with a through hole through which the projecting adapter outwardly protrudes, middle portions of two sides of the sheath are respectively formed with two inwardly extending stop boards for stopping the lateral projecting blocks of the main body from slipping out, whereby the main body is reciprocally slidable within the sheath and the projecting adapter can be extended out from the through hole of the sheath or retracted therein.

2. Assembling structure for portable memory device as claimed in claim 1, wherein the main body is composed of a bottom cover, an upper cover and a circuit board, the bottom cover being a casing having a central depression, one end of the bottom cover being formed with a radially expanded arch edge, two corners of the other end being formed with recessed sections, a projecting arch edge being formed on each recessed section and adjacent to the periphery of the opening of the bottom cover, two lateral projecting blocks being respectively formed on two sides of the bottom cover, a thread hole being formed at the center of the expanded arch edge, a memory module and relevant circuits being received in the circuit board, one end of the circuit board being formed with a through hole, while the other end thereof having an extending adapter, the upper cover being also a casing having a central depression, one end of the upper cover being formed with a through hole and an expanded arch edge respectively corresponding to the thread hole and expanded arch edge of the bottom cover, the middle of the other end of the upper cover being formed with a dent, two corners of the end of the upper cover being formed with projecting hook boards corresponding to the recessed sections, whereby the hook boards of the upper cover are inserted into the recessed sections of the bottom cover and hooked on the projecting arch edges to fix one end of the bottom cover and the upper cover, the adapter of the circuit board extending out of the dent of the upper cover, a bolt being passed through the through holes of the upper cover and the circuit board and screwed into the thread hole of the bottom cover, whereby the other end of the bottom cover and the upper cover is firmly connected to clamp the circuit board.

3. Assembling structure for portable memory device as claimed in claim 2, wherein the memory device main body further comprises a lateral decorative strip which is an arched strip, an inner side thereof being formed with multiple hook sections having opening facing downward for hooking the periphery of the expanded arch edge of the bottom cover, the periphery of the expanded arch edge of the upper cover being formed with multiple notches corresponding to the hook sections of the lateral decorative strip, the hook sections of the lateral decorative strips being respectively hooked on the expanded arch edge of the bottom cover and received in the notches of the upper cover, whereby when the upper cover is connected with the bottom cover, the mating faces thereof are snugly adjoined and the lateral decorative strip covers the seam between the upper cover and the bottom cover.

4. Assembling structure for portable memory device as claimed in claim 2, wherein two lateral projecting blocks are formed on two sides of the upper cover corresponding to the lateral projecting blocks of the bottom cover.

5. Assembling structure for portable memory device as claimed in claim 3, wherein two lateral projecting blocks are formed on two sides of the upper cover corresponding to the lateral projecting blocks of the bottom cover.

6. Assembling structure for portable memory device as claimed in claim 2, wherein a shift switch is disposed on one side of the circuit board for controlling the execution of writing of the memory module, the upper cover being formed with a lateral notch corresponding to the shift switch and the sheath being also formed with a lateral opening corresponding to the shift switch, whereby the shift switch protrudes from the lateral notch and the lateral opening and is exposed to outer side.

7. Assembling structure for portable memory device as claimed in claim 3, wherein a shift switch is disposed on one side of the circuit board for controlling the execution of writing of the memory module, the upper cover being formed with a lateral notch corresponding to the shift switch and the sheath being also formed with a lateral opening corresponding to the shift switch, whereby the shift switch protrudes from the lateral notch and the lateral opening and is exposed to outer side.

8. Assembling structure for portable memory device as claimed in claim 2, wherein the middle portion of the bottom cover or upper cover of the main body is formed with at least one projecting block, an inner side of the sheath being formed with a guide channel corresponding to the projecting block, whereby the projecting block is inlaid in the guide channel to guide the main body to slide within the sheath.

9. Assembling structure for portable memory device as claimed in claim 3, wherein the middle portion of the bottom cover or upper cover of the main body is formed with at least one projecting block, an inner side of the sheath being formed with a guide channel corresponding to the projecting block, whereby the projecting block is inlaid in the guide channel to guide the main body to slide within the sheath.

10. Assembling structure for portable memory device as claimed in claim 1, wherein at least one hook hole is formed on one end of the main body extending out from the opening of the sheath for a string or a key ring to pass therethrough and tied.

11. Assembling structure for portable memory device as claimed in claim 1, wherein the adapter is a USB plug.

* * * * *